United States Patent [19]

Hashimoto

[11] Patent Number: 4,691,123
[45] Date of Patent: Sep. 1, 1987

[54] SEMICONDUCTOR INTEGRATED CIRCUIT WITH AN INTERNAL VOLTAGE CONVERTER CIRCUIT

[75] Inventor: Kazuhiko Hashimoto, Tokyo, Japan

[73] Assignee: Kabushiki Kaisha Toshiba, Kawasaki, Japan

[21] Appl. No.: 818,670

[22] Filed: Jan. 14, 1986

[30] Foreign Application Priority Data

Jan. 14, 1985 [JP] Japan .................................. 60-4369

[51] Int. Cl.$^4$ ............................................... G05F 3/16
[52] U.S. Cl. ............................ 307/296 R; 307/200 B;
307/491; 307/496; 307/296 A; 323/311
[58] Field of Search .................... 307/200 B, 443, 448,
307/451, 468–469, 491, 584, 585, 296 R, 296 A,
297, 494, 496, 497; 365/226–229; 323/311–313

[56] References Cited

U.S. PATENT DOCUMENTS

| | | | |
|---|---|---|---|
| 4,042,841 | 8/1977 | Hills et al. ........................ | 307/448 X |
| 4,279,020 | 7/1981 | Christian et al. ................ | 365/226 X |
| 4,281,260 | 7/1981 | Moegen et al. .............. | 307/296 R X |
| 4,363,978 | 12/1982 | Heimbigner ......................... | 307/451 |
| 4,488,067 | 12/1984 | Kraft et al. ...................... | 307/450 X |
| 4,503,341 | 3/1985 | Shah ................................. | 307/443 X |
| 4,594,519 | 6/1986 | Ohtani et al. .................... | 307/451 X |

OTHER PUBLICATIONS

Itoh et al., "An Experimental 1MbDRAM with On--Chip Voltage Limiter," IEEE International Solid-State Circuits Conference, pp. 282-283, 1984.

Primary Examiner—Stanley D. Miller
Assistant Examiner—D. R. Hudspeth
Attorney, Agent, or Firm—Finnegan, Henderson, Farabow, Garrett & Dunner

[57] ABSTRACT

A semiconductor memory device of the invention is switched to an operation mode or a standby mode in response to a control signal. When the control signal indicates the standby mode, a voltage converter circuit becomes inoperative, and an external power source voltage is directly supplied to an internal circuit (e.g., a memory circuit). However, in the standby mode the internal circuit has low power consumption, and the voltage converter circuit has no power consumption, thus rendering total power consumption of the semiconductor device low. When the control signal indicates the operation mode, the voltage converter circuit drops the external power source voltage and supplies it to the internal circuit. Thus, no hot electrons are generated in elements constituting the internal circuit (e.g., CMOS transistors), and degradation of the elements is prevented.

10 Claims, 7 Drawing Figures

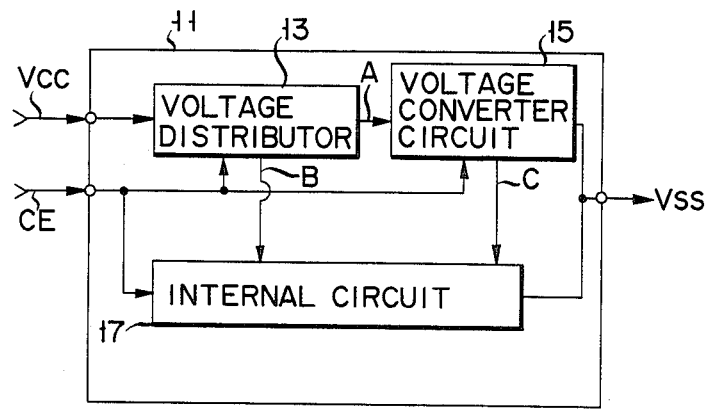
F I G. 1
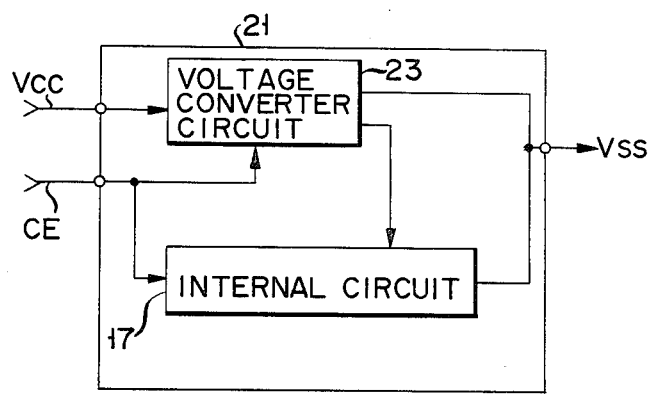
F I G. 2

FIG. 3
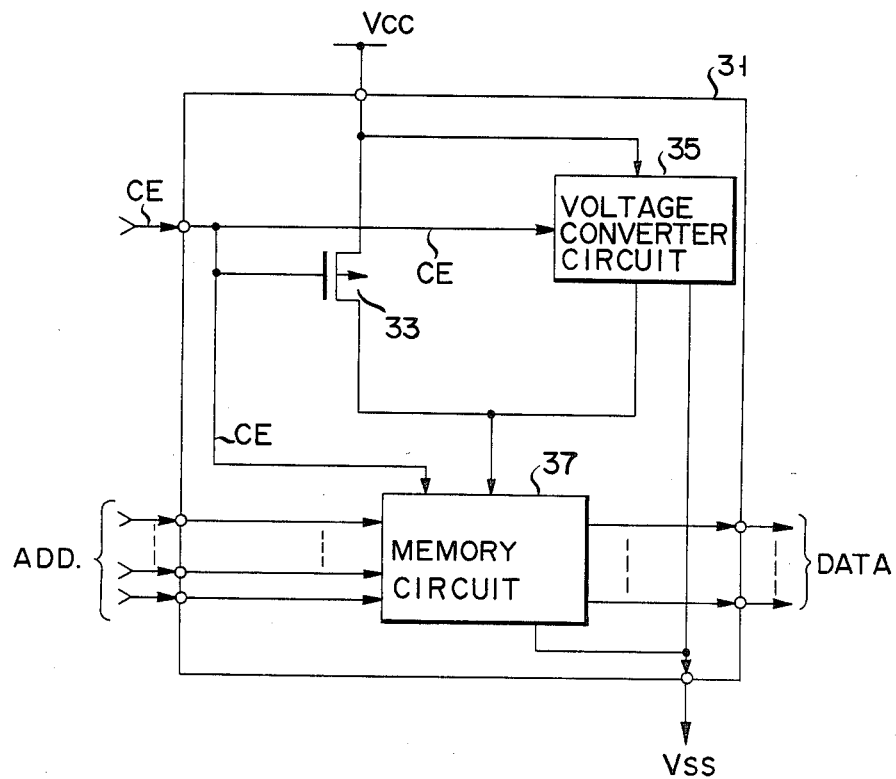
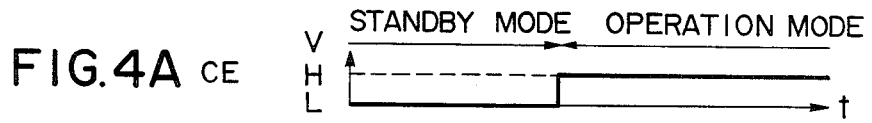
FIG. 4A
FIG. 4B

SEMICONDUCTOR INTEGRATED CIRCUIT WITH AN INTERNAL VOLTAGE CONVERTER CIRCUIT

BACKGROUND OF THE INVENTION

The present invention relates to an improvement in a semiconductor integrated circuit and, more particularly, to a semiconductor integrated circuit which converts a power source voltage supplied to the integrated circuit and supplies the converted voltage to an internal circuit thereof.

An integrated circuit (to be referred to as IC hereinafter) for example, a CMOS static random-access memory, is known. In order to provide matching with external devices, a 5-V DC voltage is supplied to a IC as a power source voltage. The power source voltage is supplied to an internal circuit of the IC. The internal elements of the IC (e.g., MOS transistors forming individual memory cells) are micropatterned in accordance with the high integration of recent ICs. When a 5-V external power source voltage is applied to the micropatterned internal elements, the internal electric field is increased, and hot electrons with high energy are generated, thus degrading the element.

In order to solve this drawback, a memory device with the following arrangement has been proposed. An external power source voltage is supplied to a voltage converter circuit. The voltage converter circuit drops the input voltage and generates a low internal power source voltage. The internal power source voltage is supplied to an internal circuit (i.e., the internal elements constituting the circuit), and the circuit is operated on this voltage. With this arrangement, since a low voltage is supplied to the internal elements, hot electrons in the elements can be suppressed and degradation of the elements is prevented.

It is also known that a CMOS IC has a standby mode, in which the IC stops operation. For example, in the standby mode a SRAM stops operation while holding its storage contents. In this mode, the current consumption of the IC is decreased, e.g., to 0.5 µA which is much lower than the current consumption (2 mA) in operation mode. Hence, ICs with low power consumption can be achieved. In the SRAM, storage contents can be held with a dry cell voltage. Thus, if a dry cell is used as a backup power source, the SRAM can be used as a nonvolatile memory device.

However, when the memory device capable of generating the internal voltage comprises a CMOS structure, the voltage converter circuit still requires power even if the internal elements consume almost no power in the standby mode. For this reason, the low power consumption of the CMOS structure cannot be taken advantage of in the standby mode. In fact, power consumption of the CMOS IC is actually increased.

SUMMARY OF THE INVENTION

It is an object of the present invention to provide an integrated circuit in which a predetermined voltage supplied to an external device can be used as a power source voltage in consideration of matching with the external device, such that degradation of internal elements due to hot electrons can be prevented and power consumption in the standby mode is reduced.

In order to achieve the above object of the present invention, there is provided a semiconductor integrated circuit, comprising:

means for receiving at least one control signal;

internal circuit means (17) which receives a first voltage (VCC or V1) and the control signal (CE), and can switch to an operation mode or a standby mode in response to the control signal (CE); and voltage switching means (13, 15) which receives a second voltage (VCC), a third voltage (VSS) which differ from the second voltage (VCC) and the control signal (CE), supplies to the internal circuit means (17) as the first voltage (V1) a voltage between the second voltage (VCC) and the third voltage in response to the control signal (CE) which indicates the operation mode, and supplies to said internal circuit means (17) as the first voltage (VCC or V1) a voltage (VCC) substantially equal to the second voltage (VCC) when the control signal (CE) indicates the standby mode.

With the above arrangement, in a semiconductor integrated circuit according to the present invention, the voltage switching means consumes almost no power and internal circuit means consumes no power in the standby mode. Thus, a semiconductor integrated circuit witn low power consumption can be realized. In addition, in the operation mode, a voltage (internal power source voltage) lower than the second voltage (external power source voltage) from the voltage switching means is supplied to the internal circuit means. Hence, hot electrons in elements constituting the internal circuit means (e.g., MOS transistors used as individual memory cells constituting a memory circuit) can be suppressed, and degradation of the elements constituting the internal circuit means can be prevented. Furthermore, the semiconductor integrated circuit can use the second voltage (e.g., 5 V) equal to the power source voltage applied to an external device.

BRIEF DESCRIPTION OF THE DRAWINGS

FIG. 1 is a block diagram for explaining a semiconductor integrated circuit according to a first embodiment of the present invention;

FIG. 2 is a block diagram for explaining a semiconductor device according to a second embodiment of the present invention;

FIG. 3 is a circuit diagram for explaining a SRAM according to a second embodiment of the present invention;

FIGS. 4A and 4B are signal waveform charts for explaining the operation of the SRAM shown in FIG. 2;

DETAILED DESCRIPTION OF THE PREFERRED EMBODIMENTS

Figure 5:
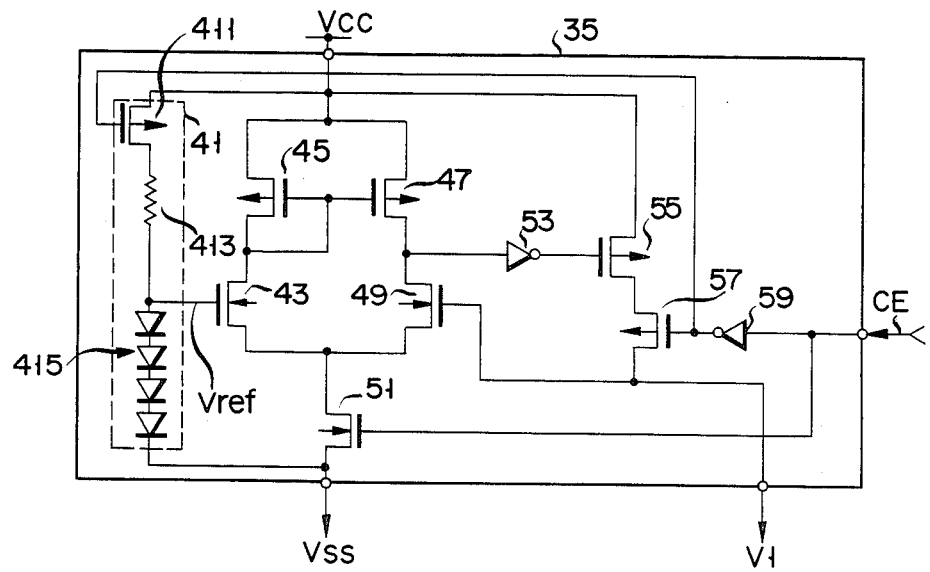
FIG. 5 is a detailed circuit diagram of a voltage converter circuit shown in FIG. 3.

A semiconductor integrated circuit according to a first embodiment of the present invention will be described with reference to FIG. 1.

Referring to FIG. 1, power source voltage VCC supplied to IC 11 is supplied to the input terminal of voltage distribution circuit 13. Note that 5-V voltage VCC, which can be commonly supplied to other devices, is used in consideration of matching with other devices. Circuit 13 is connected to voltage converter circuit 15 through power source line A, and is connected to a power source terminal of internal circuit 17 through power source line B. The output terminal of circuit 15 is connected to another power source terminal of circuit 17 through signal line C. Control signal CE is supplied to control terminals of circuits 17, 13, and 15. Another power source voltage VSS (0 V) is supplied to voltage converter circuit 15 and internal circuit 17.

The operation of IC 11 will now be described.

Control signal CE is used to set an operation mode or a standby mode. When signal CE is at H level, IC 11 is switched to the operation mode, and when signal CE is at L level, IC 11 is switched to the standby mode.

When signal CE is at H level, circuit 13 supplies voltage VCC to circuit 15 through line A and renders line B insulated. When signal CE is at L level, circuit 13 supplies voltage VCC onto line B and renders line A insulated.

When signal CE is at H level, circuit 15 receives voltage VCC supplied from circuit 13 and voltage VSS and generates internal power source voltage V1, lower than voltage VCC and higher than the voltage VSS, and supplies voltage V1 to circuit 17. When signal CE is at L level, circuit 15 is inoperative.

Circuit 17 is operated on voltage VCC supplied from circuit 13 through line B or voltage V1 supplied from circuit 15 through line C and voltage VSS. Circuit 17 is set in either the operation mode or the standby mode in accordance with control signal CE.

When signal CE is at H level, IC 11 shown in FIG. 1 is set in the operation mode. Voltage V1 from circuit 15 and voltage VSS are supplied to circuit 17. For this reason, hot electrons in elements constituting the internal circuit (e.g., in CMOS transistors) can be suppressed and degradation in the elements can be prevented, thus guaranteeing the reliability of IC 11. When control signal CE is at L level, circuit 13 supplies voltage VCC (equal to the external power source voltage) to circuit 17. At this time, circuit 17 is set in the standby mode and consumes very little power. In addition, since circuit 15 is inoperative it also consumes no or very little power. Thus, IC 11 has very low power consumption.

IC 21 according to a second embodiment of the present invention will be described with reference to FIG. 2. The same reference numerals in FIG. 2 denote the same parts as in FIG. 1, and a description thereof will be omitted.

A difference between the first embodiment, shown in FIG. 1, and the second embodiment is that ① a voltage distribution circuit is omitted, and ② external voltage VCC is directly supplied to a voltage converter circuit 23.

When signal CE is at H level, voltage converter circuit 23 generates voltage V1 between voltages VCC and VSS and supplies voltage V1 to internal circuit 17. Circuit 17 is operated in response to voltage V1. When signal CE is at L level, circuit 23 supplies voltage VCC to internal circuit 17. Circuit 17 is set in a standby mode in response to signal CE. With this arrangement, low power consumption can be achieved and degradation of elements due to hot electrons can be prevented as in the first embodiment.

A CMOS static random-access memory (SRAM) to which a third embodiment of the present invention is applied will be described in detail with reference to FIG. 3.

The structure of the SRAM will first be described.

SRAM device 31 comprises switching p-type MOS transistor 33, voltage converter circuit 35, and memory circuit 37.

Signal CE, indicating the operation mode or the standby mode, is supplied to circuits 35 and 37 and the gate of transistor 33.

External power source voltage VCC is supplied to one end of the current path of transistor 33. The other end is connected to a power source terminal of circuit 37. Voltage VCC is also supplied to circuit 35. The output terminal of circuit 35 is connected to the power source terminal of circuit 37.

Memory circuit 37 receives various signals (e.g., address signals or read/write mode switching signals). Circuit 37 accesses data at addresses designated by the address signals.

The operation of memory device 31 with the arrangement shown in FIG. 3 will be described with reference to FIGS. 4A and 4B.

Assume that signal CE is at L level, as shown in FIG. 4A. Transistor 33 is turned on upon reception of L-level signal CE at its gate. Thus, voltage VCC is supplied to the power source terminal of circuit 37. Circuit 35 is turned off and consumes almost no power. The output terminal of circuit 35 is thus set to a high inpedance state, as shown in FIG. 4B.

When signal CE goes to H level (indicating the operation mode), as shown in FIG. 4A, transistor 33 is turned off upon reception of H-level signal CE. Circuit 35 generates voltage V1 (VCC>V1>VSS, e.g., 3 V), as shown in FIG. 4B. Power source voltage V1 is then supplied to circuit 37. Circuit 37 performs data read/write access in accordance with address signals and other control signals using voltage V1.

With the above arrangement, when device 31 is set in the standby mode (i.e., when signal CE is at L level), voltage VCC is supplied to circuit 37, and circuit 35 consumes no power. For this reason, power consumption is less than in conventional devices. When device 31 is operative (i.e., when signal CE is at H level), voltage V1, lower than voltage VCC, is supplied to circuit 37. Hot electrons generated in elements constituting circuit 37 (e.g., transistors) can thus be suppressed, and degradation of circuit 37, prevented.

The circuit configuration of voltage converter circuit 35 shown in FIG. 3 will be described with reference to FIG. 5. Referring to FIG. 5, output voltage Vref from reference voltage generation circuit 41 is applied to the gate of transistor 43. Circuit 41 comprises a p-type MOS transistor 411, resistor 413 and a plurality of diodes 415. The current path of transistor 411, resistor 413 and diodes 415 are connected in series between voltages VCC and VSS. One of the current path of n-type MOS transistor 43 is connected to one end of the current path of p-type MOS transistor 45 and the gates of transistors 45 and 47. One end of the current path of p-type transistor 47 is connected to one end of the current path of n-type MOS transistor 49. External voltage VCC is applied to the other ends of the current paths of transistors 45 and 47. The other ends of the current paths of transistors 43 and 49 are connected to one end of the current path of n-type transistor 51. The other end of the current path of transistor 51 is connected to voltage VSS. Signal CE is supplied to the gate of transistor 51. A node between transistors 47 and 49 is connected to the input terminal of inverter 43. The output terminal of inverter 43 is connected to the gate of transistor 55. Voltage VCC is applied to one end of the current path of transistor 55, and the other end thereof is connected to one end of the current path of transistor 57. Signal CE is supplied to the input terminal of inverter 59, the output terminal of which is connected to the gate of transistors 57, 411. A voltage appearing at the node between the gate of transistor 49 and the other end of the current path of transistor 57 becomes output voltage V1. This voltage converter circuit 35 outputs voltage V1 which is lower than voltage VCC in the operation mode and turns off in the standby mode. In standby mode, transistor 411 is in an off state, so circuit 35 consumes little power. Since transistors 55, 57 require drive power sufficient to drive memory circuit 37, the ratio of their channel width to channel length preferably exceeds 200.

Figure 6:
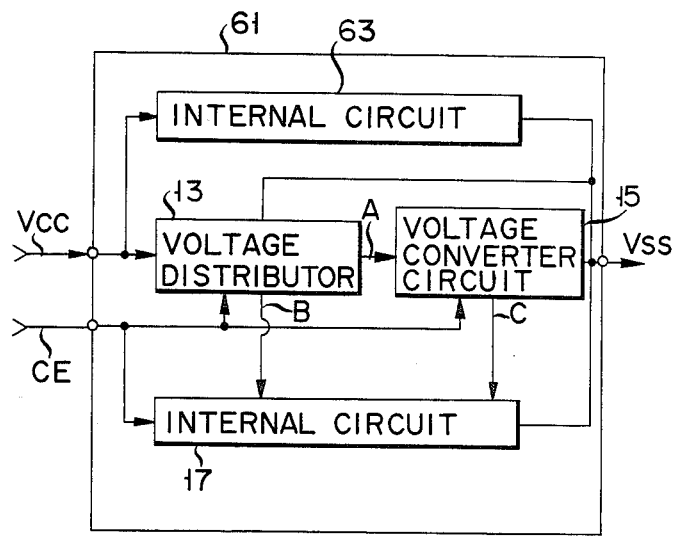
FIG. 6 is a block diagram for explaining a semiconductor device according to a fourth embodiment of the present invention.

In the above embodiments, voltages supplied to all portions of the internal circuit excluding a voltage distribution circuit and a voltage converter circuit are switched in accordance with the standby mode and the operation mode. The present invention, however, is not limited to this arrangement. For example, voltages supplied to only a limited number of portions of the internal circuit can be thus controlled. This embodiment will now be described with reference to FIG. 6. The same reference numerals in FIG. 6 denote the same parts as in FIG. 1, and a detailed description thereof will be omitted. Referring to FIG. 6, a power source voltage supplied to internal circuit 17 is switched in accordance with the operation mode and the standby mode. Another internal circuit 63, however, is continuously operated by external power source voltage VCC.

As a modification of this embodiment, a voltage supplied to the on-chip static RAM of a 1-chip microcomputer can be switched in accordance with the operation mode and the standby mode. This is not limited to 1-chip microcomputers. The supply voltage for only a CMOS internal circuit constituting part of an interface IC can be switched.

In the above embodiments, a 5-V external power source voltage is exemplified. The external power source voltage is not limited to 5 V but can be freely selected in view of matching with other external devices. Similarly, internal power source voltage V1 can be freely set in accordance with the micropatterned state of the internal elements.

Control signal CE can be either one control signal or a combination of various control signals for a memory device (e.g., a CMOS SRAM IC). For example, chip enable signal CE or $\overline{CE}$ supplied to the memory device can be used, or a special-purpose signal can be prepared. Control signal CE may be generated according to a change of address signal.

In the above embodiments, the SRAM device has mainly been discussed. However, the present invention is not limited to this embodiment or to CMOS type structures and can be applied to any semiconductor device utilizing a standby mode. The voltage distribution circuit and voltage converter circuit are not limited to particular types but can comprise any circuit configuration.

When the voltage converter circuit is inoperative, it is desirable that its power consumption be negligibly small. In FIG. 5, for example, the power consumption of voltage converter circuit 35 in the standby mode may be equal to that of memory circuit 37, but preferably smaller than 1/100 to 1/1000 of the memory circuit's power consumption.

For the above embodiments, voltages V1 (VCC>V1>VSS) and VSS are supplied to the internal circuit in the operation mode. Instead of these voltages, however, voltages V1 and VCC may be supplied to the internal circuit, or two voltage converter circuits may be used in the semiconductor integrated circuit, the first voltage converter circuit supplying voltage V1 (VCC>V1>VSS, e.g., 4 V) and the other one supplying voltage V2 (V1>V2>VSS, e.g., 1 V) to the internal circuit. The point of this invention is that the difference between the levels of the two power source voltages applied to the internal circuit in the operation mode is smaller than the difference between the levels of the power source voltages in the standby mode.

It will be apparent to those skilled in the art that various modifications and variations can be made to the semiconductor device of the present invention without departing from the scope or spirit of the invention. Thus, it is intended that the present invention cover the modifications and variations of this invention provided they come within the scope of the appended claims and their equivalents.

What is claimed is:

1. Semiconductor integrated circuit apparatus comprising:

means for receiving at least one control signal;

internal circuit means, connected to said control signal receiving means, for receiving a first voltage and said control signal and for switching between an operation mode and a stand-by mode in response to said control signal; and voltage switching means, connected to said control signal receiving means, for receiving a second voltage and a third voltage which differs from the second voltage and said at least one control signal, for supplying to said internal circuit means as said first voltage a voltage between said second voltage and said third voltage when said control signal indicates said operation mode, and for supplying to said internal circuit means as said first voltage a voltage substantially equal to said second voltage when said control signal indicates said standby mode.

2. An apparatus according to claim 1, wherein said internal circuit means comprises a plurality of CMOS transistors.

3. An apparatus according to claim 1, wherein said voltage switching means comprises:

a voltage distribution circuit; and a voltage converter circuit connected to said distribution circuit;

wherein said distribution circuit receives said control signal and said second voltage, and supplies said second voltage to said internal circuit means at times when said control signal indicates said standby mode, and supplies said second voltage to said voltage converter circuit at times when said control signal indicates said operation mode; and wherein said voltage converter circuit receives said control signal, said second voltage from said distribution means and said third voltage, and supplies a voltage of a level between the second voltage and third voltage to said internal circuit means at times when said control signal indicates said operation mode.

4. An apparatus according to claim 1, wherein said voltage switching means comprises:

distribution means, connected to said control signal receiving means for receiving said control signal and said second voltage and for supplying said second voltage to said internal circuit means in response to said control signal at times when said control signal indicates said standby mode; and voltage converter means, connected to said distribution means for receiving said control signal and said second and third voltages, for generating a voltage of a level between said second and third voltages and for supplying said generated voltage to said internal circuit means at times when said control signal indicates the operation mode.

5. An apparatus according to claim 1, wherein said internal circuit means includes a plurality of internal integrated circuits excluding said voltage switching means.

6. An apparatus according to claim 1, wherein said integrated circuit further comprises a second internal circuit means connected to receive said second voltage regardless of the logic state of said control signal.

7. An apparatus according to claim 1, wherein said apparatus is fabricated in a single chip.

8. Semiconductor integrated circuit apparatus comprising:

internal circuit means for operating from a plurality of power source voltages and for switching between an operation mode during which the level of said plurality of power source voltages differ in value by a first amount and a standby mode during which the level of said plurality of power source voltages differ in value by a second amount greater than said first amount; and voltage switching means for receiving a control signal indicative of said operation mode and said standby mode, and for supplying said power source voltages to said internal circuit means.

9. An apparatus according to claim 8, wherein said voltage switching means receives said control signal, a first power source voltage and a second power source voltage, said second power source voltage being lower than said first power source voltage and said voltage switching means supplies to said internal circuit means said second power source voltage and a third voltage, said third voltage having a first value which is smaller than said first power source voltage and larger than said second power source voltage when said control signal indicates said operation mode, and having a second value which is substantially equal to said first power source voltage when said control signal indicates said standby mode; and wherein said internal circuit means operates from said voltage from said switching means and said second power source voltage.

10. An apparatus according to claim 8, wherein said voltage switching means receives said control signal, a first power source voltage and a second power source voltage, said second power source voltage being lower than the first power source voltage, and said voltage switching means supplies to said internal circuit means a third voltage, said third voltage having a first value which is smaller than said first power source voltage and larger than said second power source voltage when said control signal indicates said operation mode, and having a second value which is substantially equal to said second power source voltage when said control signal indicates said standby mode; and wherein said internal circuit means operates from said voltage from said switching means and said first power source voltage.

* * * * *